United States Patent
Utashiro

(10) Patent No.: US 11,629,433 B2
(45) Date of Patent: Apr. 18, 2023

(54) SiC SINGLE CRYSTAL PRODUCTION APPARATUS

(71) Applicant: SHOWA DENKO K.K., Tokyo (JP)

(72) Inventor: Tomoya Utashiro, Hikone (JP)

(73) Assignee: SHOWA DENKO K.K., Tokyo (JP)

( * ) Notice: Subject to any disclaimer, the term of this patent is extended or adjusted under 35 U.S.C. 154(b) by 91 days.

(21) Appl. No.: 16/601,915

(22) Filed: Oct. 15, 2019

(65) Prior Publication Data

US 2020/0123679 A1 Apr. 23, 2020

(30) Foreign Application Priority Data

Oct. 17, 2018 (JP) .............................. JP2018-195741

(51) Int. Cl.
*C30B 35/00* (2006.01)
*C30B 29/36* (2006.01)
*C30B 23/06* (2006.01)

(52) U.S. Cl.
CPC ............ *C30B 35/002* (2013.01); *C30B 23/06* (2013.01); *C30B 29/36* (2013.01)

(58) Field of Classification Search
CPC ........ C30B 23/06; C30B 29/36; C30B 35/002
See application file for complete search history.

(56) References Cited

U.S. PATENT DOCUMENTS

| 2006/0144324 | A1* | 7/2006 | Sakaguchi | C30B 29/36 |
| | | | | 117/89 |
| 2016/0097143 | A1 | 4/2016 | Rengarajan et al. | |
| 2016/0122903 | A1* | 5/2016 | Hori | C30B 23/063 |
| | | | | 118/712 |
| 2017/0314161 | A1* | 11/2017 | Sasaki | C30B 29/36 |

FOREIGN PATENT DOCUMENTS

| CN | 102925967 A | 2/2013 |
| CN | 107075727 A | 8/2017 |
| CN | 206368217 U | 8/2017 |
| CN | 107723798 A | 2/2018 |
| JP | 2000264793 A | * 9/2000 |
| JP | 2014-005159 A | 1/2014 |
| JP | 2014-012640 A | 1/2014 |
| JP | 2016-117624 A | 6/2016 |

OTHER PUBLICATIONS

Communication dated Jan. 28, 2021 from The State Intellectual Property Office of the PR. of China in Application No. 201910972545.1.

* cited by examiner

*Primary Examiner* — Hua Qi
(74) *Attorney, Agent, or Firm* — Sughrue Mion, PLLC

(57) ABSTRACT

The invention provides a SiC single crystal production apparatus with high uniformity of temperature distribution in a crystal growth vessel. The SiC single crystal production apparatus includes a crystal growth vessel containing SiC raw material; an insulation part covering the periphery of the crystal growth vessel; a heater used to heat the crystal growth vessel; and a holding member used to hold the crystal growth vessel, wherein the crystal growth vessel is held in a suspended state by the holding member.

2 Claims, 4 Drawing Sheets

SIC SINGLE CRYSTAL PRODUCTION APPARATUS

BACKGROUND OF THE INVENTION

Field of the Invention

The present invention relates to a SiC single crystal production apparatus.

Priority is claimed on Japanese Patent Application No. 2018-195741, filed Oct. 17, 2018, the content of which is incorporated herein by reference.

Description of Related Art

Silicon carbide (SiC) has a dielectric breakdown field that is one order of magnitude larger than silicon (Si) and a band gap that is three times larger than the same. Silicon carbide (SiC) is characterized by having a thermal conductivity about three times higher than that of silicon (Si). Silicon carbide (SiC) is expected to be applied to power devices, high-frequency devices, high-temperature operating devices, and the like. For this reason, in recent years, a SiC epitaxial wafer has been used for the above semiconductor devices.

The SiC epitaxial wafer is produced by growing a SiC epitaxial film serving as an active region of a SiC semiconductor device on a SiC single crystal substrate by using chemical vapor deposition (CVD).

The SiC single crystal substrate is produced by cutting out a SiC single crystal. A sublimation method is widely known as one of the methods for producing the SiC single crystal. The sublimation method is a method of growing a seed crystal into a larger SiC single crystal. In the sublimation method, a crystal growth vessel (crucible) having a raw material storage part for storing SiC raw material and a lid part provided with a seed crystal holding part for holding a seed crystal is generally used. The crystal growth vessel is heated to sublimate the SiC raw material, and the generated sublimation gas is supplied to the seed crystal to grow the seed crystal to a SiC single crystal.

In recent years, it is necessary to increase the diameter of a SiC single crystal substrate on which a SiC epitaxial film is grown to satisfy market demand. Therefore, there is a growing demand for larger diameters and longer lengths of the SiC single crystal itself. As the demand for larger and longer SiC single crystals increase, the demand for higher quality is also increasing. In the crystal growth of a SiC single crystal, there are various factors that affect its quality.

The temperature conditions in the crystal growth vessel and the shape of the SiC single crystal when the crystal growth vessel is heated to grow the SiC single crystal are factors that affect the quality of the SiC single crystal.

Patent Document 1 describes a method of controlling the shape of a SiC single crystal by providing insulation part at a predetermined position. Patent Document 2 describes that the temperature distribution in the crystal growth vessel can be controlled by arranging the insulation part in a closed space separated from the raw material gas.

PATENT DOCUMENTS

[Patent Document 1] Japanese Unexamined Patent Application, First Publication No. 2014-12640
[Patent Document 2] Japanese Unexamined Patent Application, First Publication No. 2016-117624

SUMMARY OF THE INVENTION

When the crystal growth vessel is heated, the crystal growth vessel is generally placed on a pedestal having a high heat resistance and heated from the outside using an induction heater or a resistance heater. However, the crystal growth vessel has been enlarged in response to the demand for a large-diameter SiC single crystal substrate. The enlarged crystal growth vessel makes it difficult to transmit heat from the outside to the center of the crystal growth vessel. If the temperature in the center of the crystal growth vessel is low, a sublimation gas generated in the crystal growth vessel may be recrystallized in the center of the crystal growth vessel and cannot be used for the growth of the SiC single crystal. Therefore, it is desirable to make the temperature distribution in the crystal growth vessel uniform. However, it is difficult to make the temperature distribution in the crystal growth vessel uniform by only using the insulation part as described in Patent Documents 1 and 2.

The present invention has been made in view of the above problems, and an object thereof is to provide a SiC single crystal production apparatus with high uniformity of temperature distribution in a crystal growth vessel.

As a result of intensive studies, the present inventors are able to maintain a uniform crystal temperature distribution in the crystal growth vessel by holding the crystal growth vessel in a floating state, or in a suspended state in the SiC single crystal production apparatus.

In particular, in the case of a crystal growth vessel with a pedestal, the crystal growth vessel is in a floating state, or in a suspended state from the pedestal, so that heat inside the crystal growth vessel is prevented from being dissipated outside via the pedestal. As a result, it was found that it is possible to make the temperature distribution in the crystal growth vessel uniform by using the SiC single crystal production apparatus having the above-mentioned structure.

This invention provides the following means in order to solve the said subject.

(1) A SiC single crystal production apparatus, including:
a crystal growth vessel containing SiC raw material;
an insulation part covering the periphery of the crystal growth vessel;
a heater used to heat the crystal growth vessel; and
a holding member used to hold the crystal growth vessel;
wherein the crystal growth vessel is held in suspended state by the holding member.

(2) The SiC single crystal production apparatus according to the above aspect, wherein the holding member includes
a first holding part fixed to the SiC single crystal production apparatus;
a second holding part fixed to the first holding part; and
an engaging part that engages the crystal growth vessel and the second holding part,
wherein the crystal growth vessel is held in a suspended state by engaging the engaging part with a side surface of the crystal growth vessel.

(3) The SiC single crystal production apparatus according to the above aspect (1) or (2), wherein the holding member includes
a pedestal;
a strut fixed to the pedestal;
a projection provided in the strut, and
wherein the crystal growth vessel is held in a suspended state by engaging the projection with a side surface of the crystal growth vessel.

According to the present invention, it is possible to provide a SiC single crystal production apparatus with high uniformity of temperature distribution in the crystal growth vessel.

DETAILED DESCRIPTION OF THE INVENTION

Figure 1:
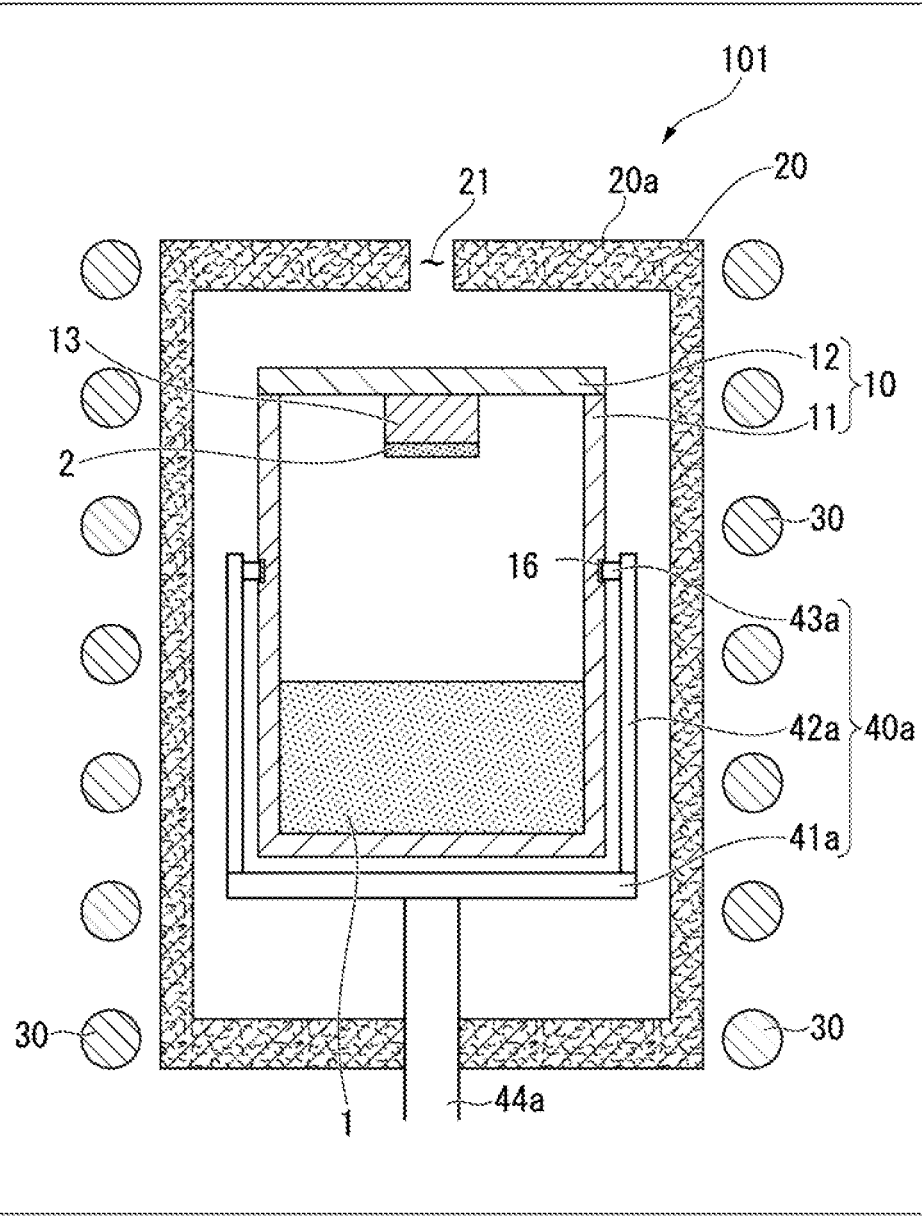
FIG. 1 is a schematic cross-sectional view of the SiC single crystal production apparatus according to the first embodiment of the present invention.

Hereinafter, the SiC single crystal production apparatus according to an embodiment of the present invention will be described in detail with reference to the drawings as appropriate. In the drawings used in the following description, in order to make the characteristics of the present invention easier to understand, there are cases where the characteristic parts are enlarged for the sake of convenience, and the dimensional ratios of the respective components are different from the actual ones. The materials, dimensions, and the like exemplified in the following description are merely examples, and the present invention is not limited to these and can be implemented with appropriate modifications within the scope of the effects of the present invention.

The SiC single crystal production apparatus of the present invention includes a crystal growth vessel containing a SiC raw material, an insulation part covering the periphery of the crystal growth vessel, a heater used to heat the crystal growth vessel, and a holding member used to hold the crystal growth vessel. The crystal growth vessel is held in a suspended state by the holding member.

In the present invention, "the crystal growth vessel is held in a suspended state" means that the crystal growth vessel is held in a state where a space exists between the bottom surface side and the apparatus. The crystal growth vessel may or may not move freely. As a method of holding the crystal growth vessel in the suspended state, it is not particularly limited as long as the crystal growth vessel is held in a state where a space exists between the bottom surface side and the apparatus.

The holding member preferably includes a first holding part fixed to the SiC single crystal production apparatus, a second holding part fixed to the first holding part, and an engaging part engaged with the crystal growth vessel and the second holding part. The crystal growth vessel is held in a suspended state by engaging the engaging part with the side surface of the crystal growth vessel.

Examples of the holding member include the holding member 40a of the first embodiment (described later) shown in FIG. 1 and the holding member 40b of the second embodiment (described later) shown in FIG. 2. Examples of the first holding part include a pedestal 41a shown in FIG. 1 and a pedestal 41b shown in FIG. 2. Examples of the second holding part include the strut 42b shown in FIG. 1 and the strut 42b shown in FIG. 2 Examples of the engaging part include a projection 43a shown in FIG. 1 and a projection 43b shown in FIG. 2.

First Embodiment

FIG. 1 is a schematic cross-sectional view of the SiC single crystal production apparatus according to the first embodiment of the present invention.

A SiC single crystal production apparatus 101 shown in FIG. 1 includes a crystal growth vessel 10, an insulation part 20, a heater 30, and a holding member 40a.

The crystal growth vessel 10 has a raw material storage part 11 and a lid part 12. The raw material storage part 11 accommodates a SiC raw material 1. The lid part 12 has a seed crystal holding part 13 for holding a seed crystal 2. As a material for the raw material storage part 11 and the lid part 12, for example, graphite, tantalum carbide, or the like can be used.

The insulation part 20 is arranged around the crystal growth vessel 10 so as to cover the crystal growth vessel 10. The insulation part 20 is not particularly limited, and a well-known insulation part utilized as insulation part for a SiC single crystal production apparatus, such as a carbon fiber felt, can be used. A through hole 21 is formed in the top part 20a of the insulation part 20, and the temperature of the lid part 12 can be measured through the through hole 21 by using a non-contact temperature measuring device. A radiation thermometer can be used as the non-contact temperature measuring device.

The heater 30 is not particularly limited, and the well-known heater currently utilized as a heater for SiC single crystal production apparatus, such as a resistance heater and an induction heater, can be used. The heater 30 shown in FIG. 1 is an induction heater using a high-frequency coil.

The holding member 40a includes a pedestal 41a, a strut 42a fixed to the pedestal 41a, and a projection 43a provided in the strut 42a. The pedestal 41a is disposed below the crystal growth vessel 10, and the strut 42a extends upward. A recess 16 is provided on the side surface of the crystal growth vessel 10. By inserting the projection 43a of the strut 42a into the recess 16 of the crystal growth vessel 10 and engaging the holding member 40a and the crystal growth vessel 10, the crystal growth vessel 10 is held in a floating state, or in a suspended state from the pedestal 41a. As a material of the pedestal 41a and strut 42a, for example, graphite, tantalum carbide, or the like can be used. The holding member 40a is held by a main shaft 44 a that penetrates the bottom of the insulation part 20.

In the SiC single crystal production apparatus 101 of this embodiment, the crystal growth vessel 10 is heated by the heater 30. By heating the crystal growth vessel 10, the SiC raw material 1 accommodated in the raw material storage part 11 of the crystal growth vessel 10 is sublimated to generate sublimation gas. The sublimation gas contacts the seed crystal 2 held by the seed crystal holding part 13 of the lid part 12 and grows the seed crystal 2 into a SiC single crystal.

In the SiC single crystal production apparatus 101 of this embodiment, the crystal growth vessel 10 is held in the suspended state by the holding member 40a. For this reason, it is possible to suppress the heat of the heated crystal growth vessel 10 from being radiated to the outside via the pedal 41a by the heater 30. Therefore, the uniformity of the temperature distribution in the crystal growth vessel 10 is improved. Further, the uniform temperature distribution in the crystal growth vessel 10 makes it difficult for the sublimation gas generated in the crystal growth vessel 10 to recrystallize in the center of the crystal growth vessel 10. It becomes possible to stably produce a SiC single crystal having a large diameter.

Second Embodiment

Figure 2:
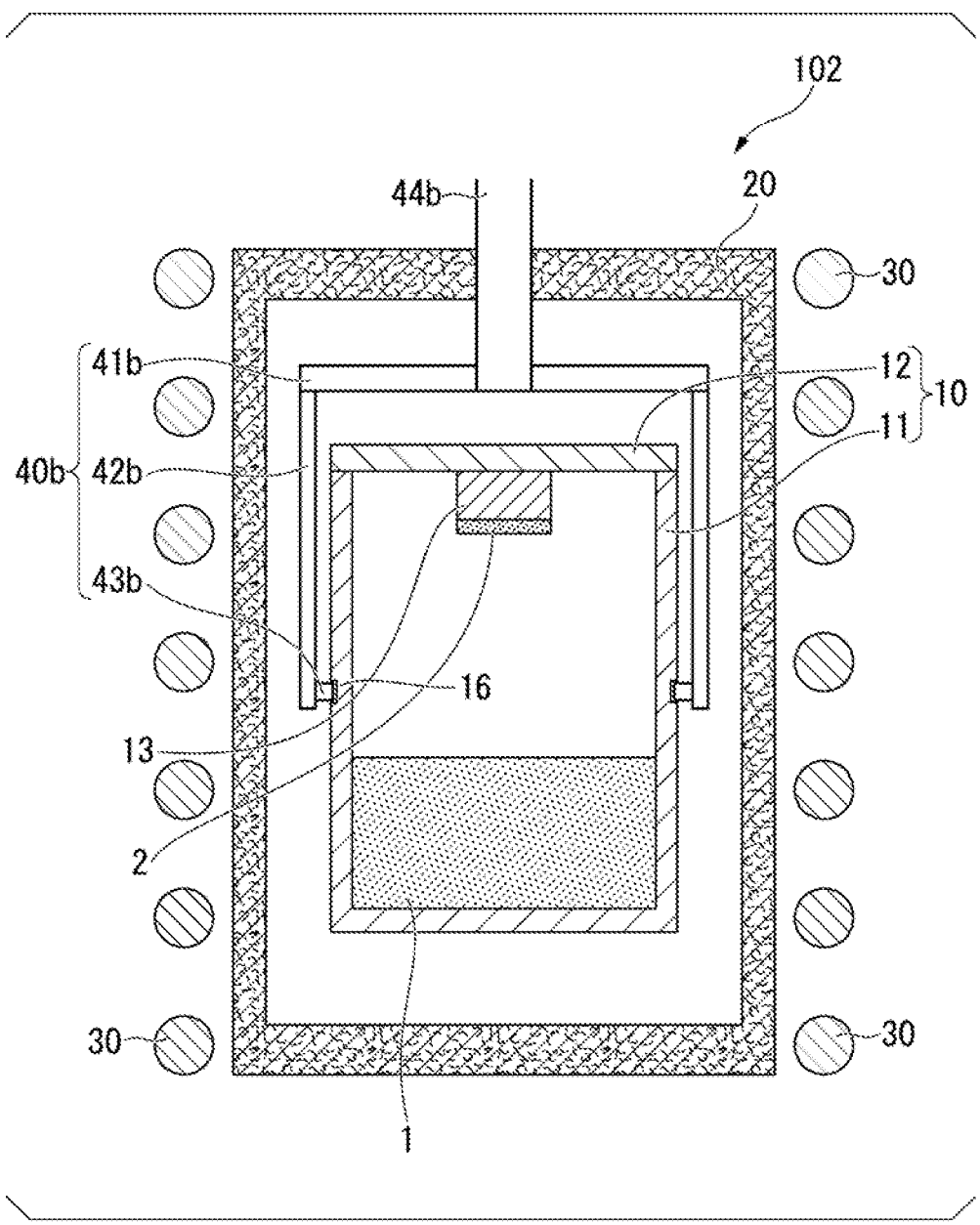
FIG. 2 is a schematic cross-sectional view of the SiC single crystal production apparatus according to a second embodiment of the present invention.

FIG. 2 is a schematic cross-sectional view of SiC single crystal production apparatus according to the second embodiment of the present invention.

The SiC single crystal production apparatus 102 shown in FIG. 2 is different from the SiC single crystal production apparatus 101 of the first Embodiment in that the pedestal 41*b* of the holding member 40*b* is arranged above the crystal growth vessel 10, and the strut 42*b* extends downward. In addition, the parts of the SiC single crystal production apparatus 102 shown in FIG. 2, which are the same as the parts of the SiC single crystal production apparatus 101 of the first Embodiment, are denoted by the same reference numerals, and description thereof is omitted.

In the SiC single crystal production apparatus 102 of the present embodiment, by inserting the projection 43*b* provided in the strut 42*b* of the holding member 40*b* into a recess 16 of the crystal growth vessel 10 and engaging the holding member 40*b* and the crystal growth vessel 10, the crystal growth vessel 10 is held in a suspended state from the pedal 41*b*. For this reason, it can prevent the heat of the heated crystal growth vessel 10 from being thermally radiated outside via the pedal 41*b* by the heater 30. Therefore, the uniformity of the temperature distribution in the crystal growth vessel 10 is improved. Further, the uniform temperature distribution in the crystal growth vessel 10 makes it difficult for the sublimation gas generated in the crystal growth vessel 10 to recrystallize in the center of the crystal growth vessel 10. It becomes possible to produce a SiC single crystal with a large diameter in a stable manner. The holding member 40*b* is held by a main shaft 44*b* penetrating the top part of the insulation part 20.

Third Embodiment

Figure 3:
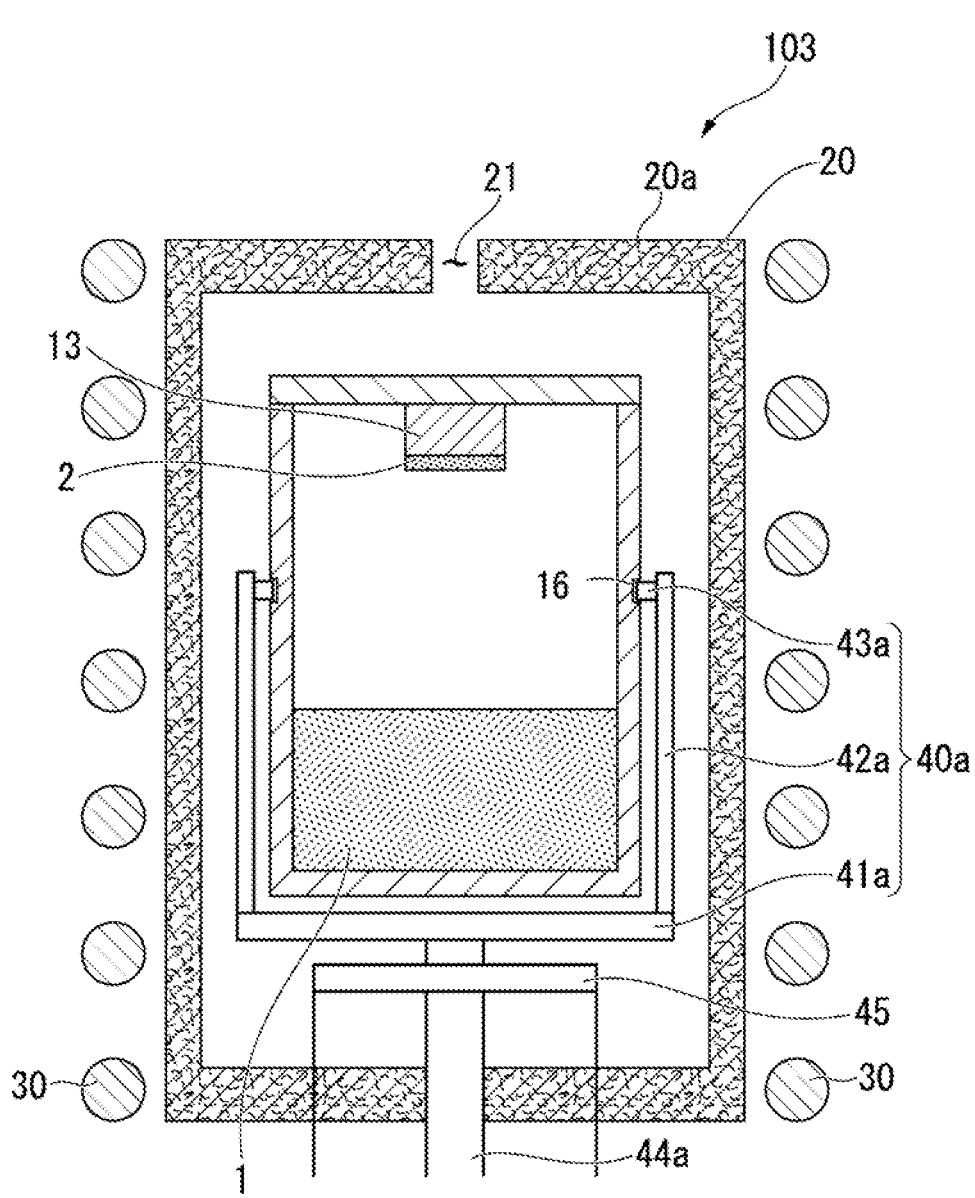
FIG. 3 is a schematic cross-sectional view of the SiC single crystal production apparatus according to a third embodiment of the present invention.

FIG. 3 is a schematic sectional view of SiC single crystal production apparatus according to the third embodiment of the present invention.

The SiC single crystal production apparatus 103 shown in FIG. 3 is different from the SiC single crystal production apparatus 101 of the first embodiment in that a sub-heater 45 is provided in the vicinity of the pedal 41*a* of the holding member 40*a*. In addition, the parts of the SiC single crystal production apparatus 103, which is the same as the parts of the SiC single crystal production apparatus 101 of the first Embodiment, are denoted by the same reference numerals, and description thereof is omitted.

In the SiC single crystal production apparatus 103 of the present embodiment, by using the sub-heater 45 provided in the vicinity of the pedal 41*a*, the bottom of the crystal growth vessel 10 that is difficult to heat with the heater 30 disposed on the side of the crystal growth vessel 10 can be heated. Therefore, the uniformity of temperature distribution in the crystal growth vessel 10 is further improved by the effect of suppressing heat dissipation by holding the crystal growth vessel 10 in the suspended state and the heating effect by using the sub-heater 45. Further, the uniform temperature distribution in the crystal growth vessel 10 makes it difficult for the sublimation gas generated in the crystal growth vessel 10 to recrystallize in the center of the crystal growth vessel 10. It becomes possible to produce a SiC single crystal with a large diameter.

Fourth Embodiment

Figure 4:
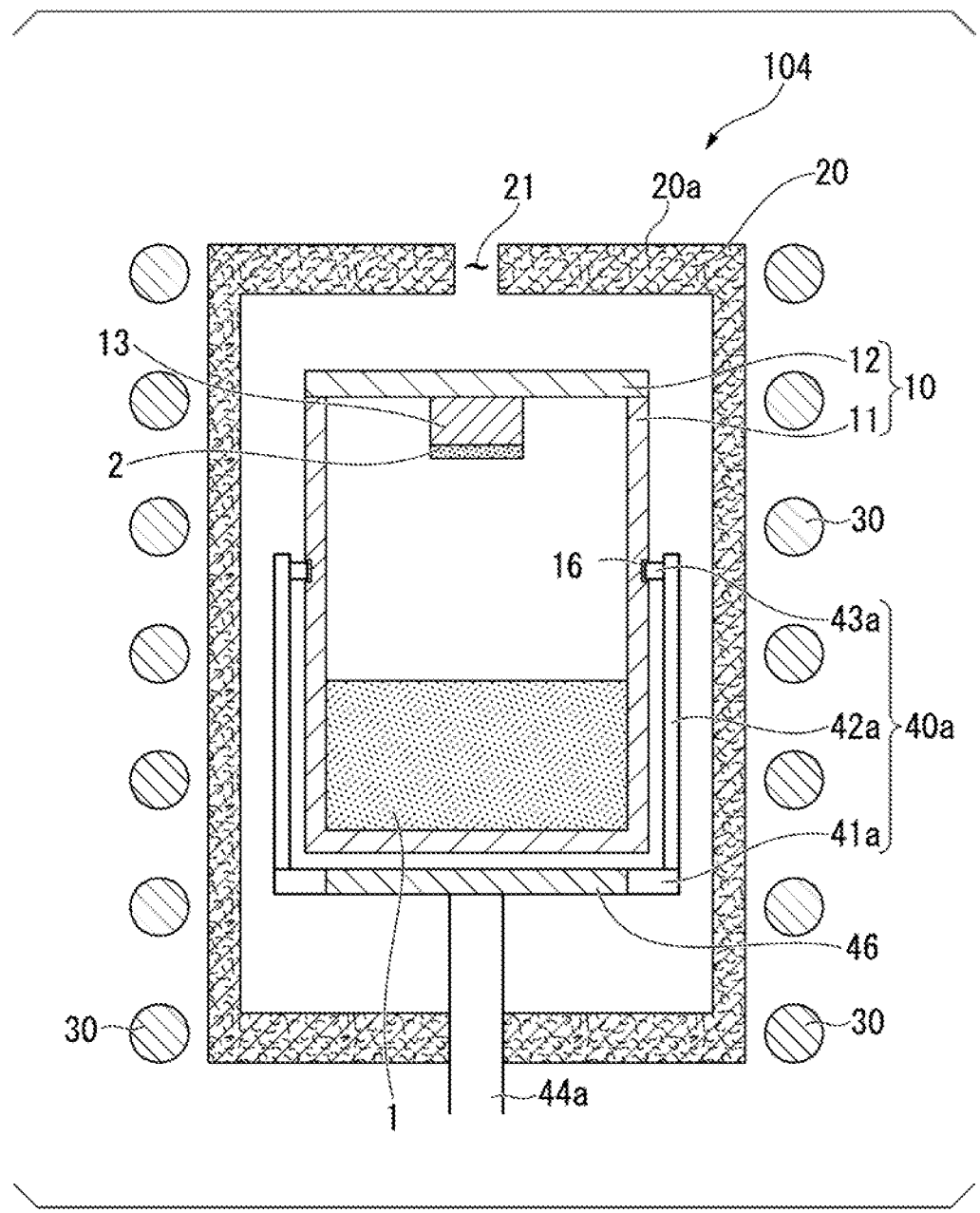
FIG. 4 is a schematic cross-sectional view of the SiC single crystal production apparatus according to a fourth embodiment of the present invention.

FIG. 4 is a schematic cross-sectional view of the SiC single crystal production apparatus according to the fourth embodiment of the present invention.

The SiC single crystal production apparatus 104 shown in FIG. 4 is different from the SiC single crystal production apparatus 101 of the first embodiment in that an induction heating part 46 is provided in the pedal 41*a* of the holding member 40*a*. In addition, the parts of the SiC single crystal production apparatus 104 of this embodiment that are the same as the parts the SiC single crystal production apparatus 101 of the first Embodiment are denoted by the same reference numerals, and description thereof is omitted.

In the SiC single crystal production apparatus 104 of this embodiment, the induction heating part 46 provided in the pedal 41*a* can heat the bottom of the crystal growth vessel 10 that is difficult to heat with the heater 30 disposed on the side of the crystal growth vessel 10. Therefore, the uniformity of temperature distribution in the crystal growth vessel 10 is further improved by the effect of suppressing heat dissipation by holding the crystal growth vessel 10 in the suspended state and by the heating effect of the induction heating part 46. Further, the uniform temperature distribution in the crystal growth vessel 10 makes it difficult for the sublimation gas generated in the crystal growth vessel 10 to recrystallize in the center of the crystal growth vessel 10. It becomes possible to produce a SiC single crystal with a large diameter.

As mentioned above, although several embodiments of this invention were described, the invention is not limited to them. It is possible to implement suitable changes within the scope of the effect of this invention. For example, in the SiC single crystal production apparatuses 101 to 104 of the first to fourth embodiments described above, the holding members 40*a* and the crystal growth vessel 10 are engaged by inserting the projections 43*a* of the struts 42*a* into the recess 16 of the crystal growth vessel 10, and the holding members 40*b* and the crystal growth vessel 10 are engaged by inserting the projections 43*b* of the struts 42*b* into the recess 16 of the crystal growth vessel 10. However, there is no particular limitation on the method of engaging the holding members 40*a* and 40*b* with the crystal growth vessel 10. For example, projections may be provided on the side surfaces of the crystal growth vessel 10, recesses 16 may be provided in the struts 42*a* or 42*b*, and projections of the crystal growth vessel 10 may be inserted into the recesses 16 in the struts 42*a* or 42*b*. Further, projections may be provided on the side surfaces of the crystal growth vessel 10 and the struts 42*a* and 42*b*, so that the projections of the crystal growth vessel 10 and the projections of the struts 42*a* may be connected and the projections of the crystal growth vessel 10 and the projections of the struts 42*b* may be connected. The number of each of struts 42*a* and 42*b* may be three or more. When three or more struts 42*a* or 42*b* are used, it is preferable to arrange the struts at equal intervals.

Further, in the SiC single crystal production apparatuses 101, 103, 104 of the first, third, and fourth embodiments, instead of providing the projection 43*a* in the strut 42*a*, a bump part is provided around the crystal growth vessel, and the lower surface of the bump part and the tip of the strut 42*a* may be directly connected to each other.

Furthermore, in the SiC single crystal production apparatus 102 of the second embodiment, the main shaft 44*b* may be directly connected to the lid part 12 of the crystal growth vessel 10 as a holding member.

EXPLANATION OF REFERENCE NUMERALS

1 SiC raw material 2 seed crystal 10 crystal growth vessel 11 raw material storage part 12 lid part 13 seed crystal holding part 16 recess 20 insulation part 20*a* top part 21 through hole 30 heater 40*a*, 40*b* holding member 41*a*, 41*b* pedestal 42*a*, 42*b* strut 43*a*, 43*b* projection 44*a*, 44*b* main shaft 45 sub-heater 46 induction heating part 101, 102, 103, 104 SiC single crystal production apparatus

What is claimed is:

1. A SiC single crystal production apparatus, comprising:
a crystal growth vessel containing a SiC raw material;
an insulation part covering the periphery of the crystal growth vessel;
a heater used to heat the crystal growth vessel; and
a holding member used to hold the crystal growth vessel,
wherein the holding member comprises;
a pedestal;
two struts fixed to the pedestal;
a first end of a projection being provided in the strut, and
a second end of the projection engaging a central portion of a side surface of the crystal growth vessel so as to hold the crystal growth vessel in a floating state from the pedestal and thereby allow the crystal growth vessel to move freely, and
wherein the heater is located more outside the crystal growth vessel than the holding member, and
the heater is located more outside the crystal growth vessel than the insulation part.

2. The SiC single crystal production apparatus according to claim 1, wherein the second end of the projection is inserted into a recess in the side surface of the crystal growth vessel.

* * * * *